US008817539B2

(12) United States Patent
Choi (10) Patent No.: US 8,817,539 B2
(45) Date of Patent: Aug. 26, 2014

(54) SEMICONDUCTOR MEMORY DEVICE, OPERATING METHOD THEREOF, AND MEMORY SYSTEM INCLUDING THE SAME

(71) Applicant: SK hynix Inc., Gyeonggi-do (KR)

(72) Inventor: Sang Moo Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/829,294

(22) Filed: Mar. 14, 2013

(65) Prior Publication Data

US 2014/0063951 A1 Mar. 6, 2014

(30) Foreign Application Priority Data

Aug. 29, 2012 (KR) ........................ 10-2012-0095095

(51) Int. Cl.
*G11C 16/04* (2006.01)

(52) U.S. Cl.
USPC ............ 365/185.11; 365/185.17; 365/185.12; 365/185.18

(58) Field of Classification Search
CPC .... G11C 16/0483; G11C 16/10; G11C 16/16; G11C 16/26; G11C 11/5628; G11C 16/24
USPC .............. 365/185.11, 185.17, 185.12, 185.18
See application file for complete search history.

(56) References Cited

U.S. PATENT DOCUMENTS 8,537,615 B2 * 9/2013 Maeda ...................... 365/185.11

FOREIGN PATENT DOCUMENTS

| KR | 1020090106869 | 10/2009 |
| KR | 1020110009503 | 1/2011 |
| KR | 1020110133323 | 12/2011 |

\* cited by examiner

*Primary Examiner* — David Lam
(74) *Attorney, Agent, or Firm* — IP & T Group LLP

(57) ABSTRACT

An operating method of a semiconductor memory device is provided. The method includes supplying a first voltage to a selected bit line where a selected memory cell among memory cells is connected and a second voltage, which is higher than the first voltage, to an unselected bit line, supplying a third voltage to a selected drain select line where the selected memory cell is connected, and a fourth voltage lower than the third voltage to an unselected drain select line; and supplying a fifth voltage to a selected word line where the selected memory cell is connected, and a sixth voltage, which is lower than the fifth voltage, to an unselected word lines for a program operation.

20 Claims, 13 Drawing Sheets

| Program operation | | | |
|---|---|---|---|
| Node | Bias | Node | Bias |
| Selected BL | Vref | Unselected BL | 2Vref |
| Selected DSL | 2Vref | Unselected DSL | Vref |
| Selected WL | Vpgm +Vref | Unselected WL | Vpass +Vref |
| SSL | Vss | CSL | Vref |

SEMICONDUCTOR MEMORY DEVICE, OPERATING METHOD THEREOF, AND MEMORY SYSTEM INCLUDING THE SAME

CROSS-REFERENCE TO RELATED APPLICATION

This application claims priority to and the benefit of Korean Patent Application No. 10-2012-0095095, filed Aug. 29, 2012, the disclosure of which is incorporated herein by reference in its entirety.

BACKGROUND

The embodiments of the present invention relate to a semiconductor memory device performing a program operation, an operating process thereof, and a memory system including the same.

Figure 1:
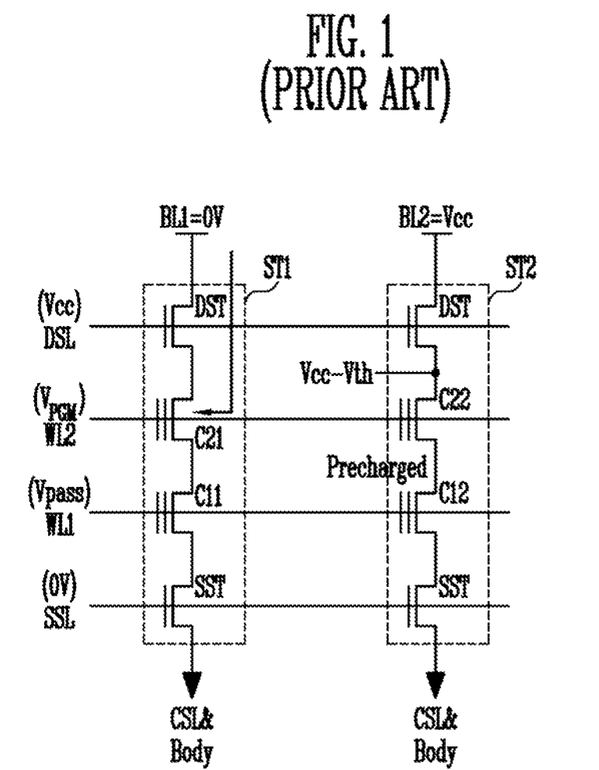
FIG. 1 is a circuit diagram illustrating a program operation of a two-dimensional (2D) semiconductor memory device.

FIG. 1 is a circuit diagram for describing a program operation of a two-dimensional (2D) semiconductor memory device.

FIG. 1 illustrates a memory block including two memory strings ST1 and ST2. Each memory string includes a drain select transistor DST, memory cells C1 and C2, and a source select transistor SST, which are connected in series between bit lines BL1 and BL2 and a common source line CSL. For convenience of description, an exemplary embodiment in which a cell string includes two memory cells C1 and C2 will be described.

The device performs a program operation to store data to the memory cell C21, which is connected to a second word line WL2 and the first bit line BL1 among the memory cells included in the first string ST1. A program permission voltage (for example, 0V) is supplied to the selected first bit line BL1, and a program inhibition voltage (for example, Vcc) is supplied to the unselected second bit line BL2. A program voltage Vpgm is supplied to the selected second word line WL2, and a pass voltage Vpass is supplied to an unselected first word line WL1. A supply voltage (for example, Vcc) is supplied to the drain select transistor DST, and a ground voltage (for example, 0 V) is supplied to the source select transistor SST. In this case, a channel of the second string ST2 is precharged to a voltage level between Vcc and Vth. The channel of the second string ST2 is boosted thereafter, and thereby a memory cell C22 connected to the second word line WL2 and the second bit line BL2 is program-inhibited while the memory cell is programmed.

Recently, a three-dimensional (3D) memory device has been studied for high integration of the memory device. Since memory cells are arranged in a three-dimensional array in the three-dimensional memory device, there are differences between the three-dimensional memory device and the two-dimensional memory device in terms of operation characteristics.

Accordingly, the operation needs to be adjusted to accommodate the operation characteristics of the three-dimensional memory device.

SUMMARY OF THE INVENTION

The embodiments of the present invention are directed to a semiconductor memory device that may prevent a program disturbance, an operating method thereof, and a memory system including the same.

One aspect of the present invention provides a method of operating a semiconductor memory device having plural memory strings each of which has plural memory cells defined by word lines surrounding a vertical channel layer connected between a bit line and a common source line at different levels from a semiconductor substrate. The method includes supplying a first voltage to a selected bit line where a selected memory cell among memory cells is connected and a second voltage, which is higher than the first voltage, to an unselected bit line, supplying a third voltage to a selected drain select line where the selected memory cell is connected, and a fourth voltage, which is lower than the third voltage, to an unselected drain select line, and supplying a fifth voltage to a selected word line where the selected memory cell is connected, and a sixth voltage, which is lower than the fifth voltage, to an unselected word lines, for a program operation.

Another aspect of the present invention provides a semiconductor memory device including: a memory block including plural memory strings each of which has plural memory cells defined by word lines surrounding a vertical channel layer at different levels from a semiconductor substrate, wherein the vertical channel layer is connected between a bit line and a common source line, and a peripheral circuit configured to supply a first voltage to a selected bit line to which selected memory cells are connected, a second voltage higher than the first voltage to an unselected bit line, a third voltage to a selected drain select line to which the selected memory cell is connected, a fourth voltage lower than the third voltage to an unselected drain select line, a fifth voltage to a selected word line to which the selected memory cell is connected, and a sixth voltage lower than the fifth voltage to an unselected word line, during the program operation.

Still another aspect of the present invention provides a semiconductor memory device including: a memory block including word lines surrounding a vertical channel layer connected between one of bit lines and a common source line at different levels from a semiconductor substrate, and including plural memory strings each of which has plural memory cells formed at areas at which the word lines surround the vertical channel layer, a page buffer connected to the memory block through the bit lines and configured to supply a first voltage to a selected bit line to which selected memory cells are connected and a second voltage higher than the first voltage to an unselected bit line during a program operation, and a voltage supply connected to the memory block through the word lines and select lines, and configured to supply a third voltage to a selected drain select line to which the selected memory cell is connected, a fourth voltage lower than the third voltage to an unselected drain select line, a fifth voltage to a selected word line to which the selected memory cell is connected, and a sixth voltage lower than the fifth voltage to an unselected word line, during the program operation.

BRIEF DESCRIPTION OF THE DRAWINGS

The above and other features and advantages of the embodiments of the present invention will become more apparent to those of ordinary skill in the art by describing in detail exemplary embodiments thereof with reference to the attached drawings in which.

DETAILED DESCRIPTION OF EMBODIMENTS

The embodiments of the present invention will be described more fully hereinafter with reference to the accompanying drawings, in which exemplary embodiments of the present invention are shown. The present invention may, however, be embodied in various forms different from exemplary embodiments and should not be construed as limited to the embodiments set forth herein. The numerical expression shown in the drawings and this description should not be construed as limited to the specific number of elements or specific sequence of process. It is also noted that in this specification, connected/coupled refers to one component not only directly coupling another component but also indirectly coupling another component through an intermediate component. In addition, a singular form may include a plural form as long as it is not specifically mentioned in a sentence.

Figure 2:
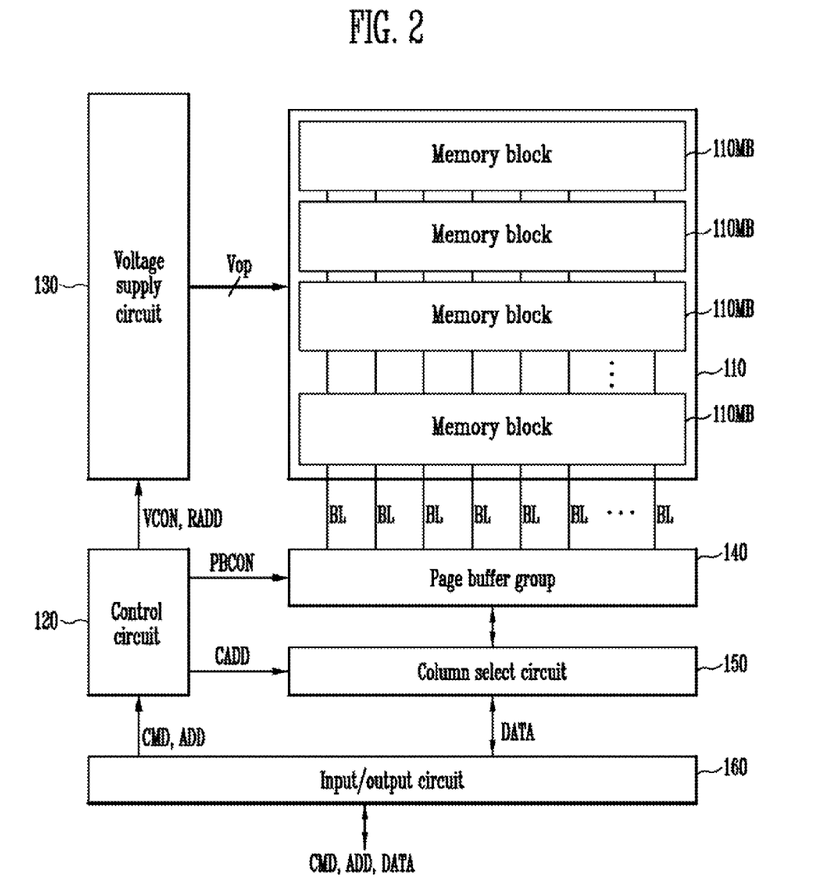
FIG. 2 is a block diagram illustrating a semiconductor memory device according to an exemplary embodiment of the present invention.
Figure 3A:
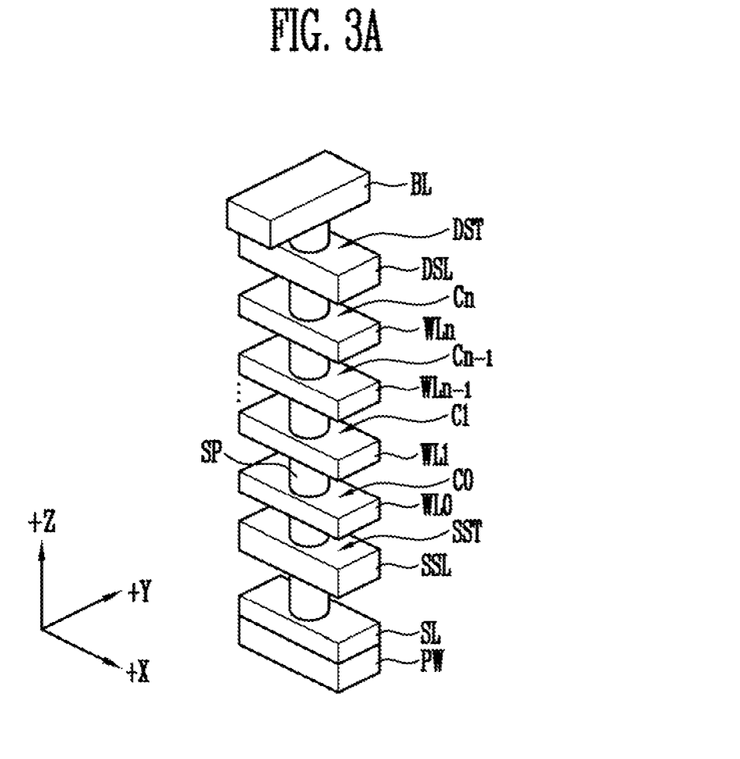
FIGS. 3A and 3B are diagrams illustrating an exemplary embodiment of a memory block in FIG. 2.
Figure 3B:
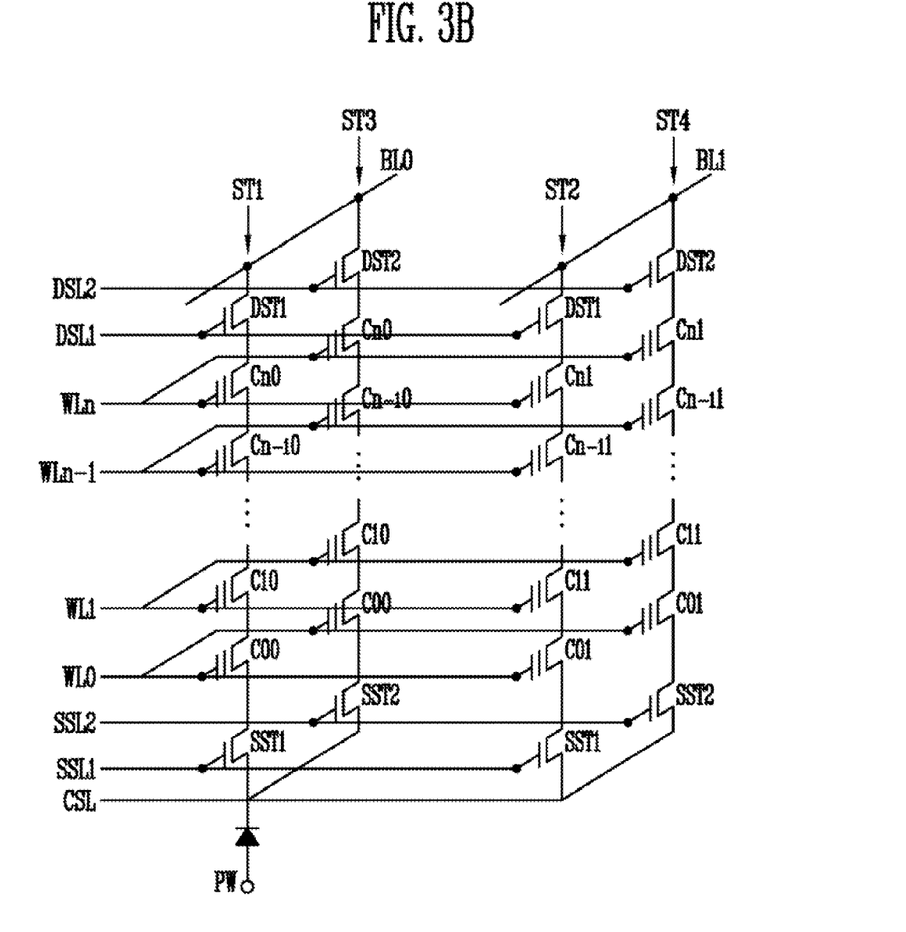
Figure 4A:
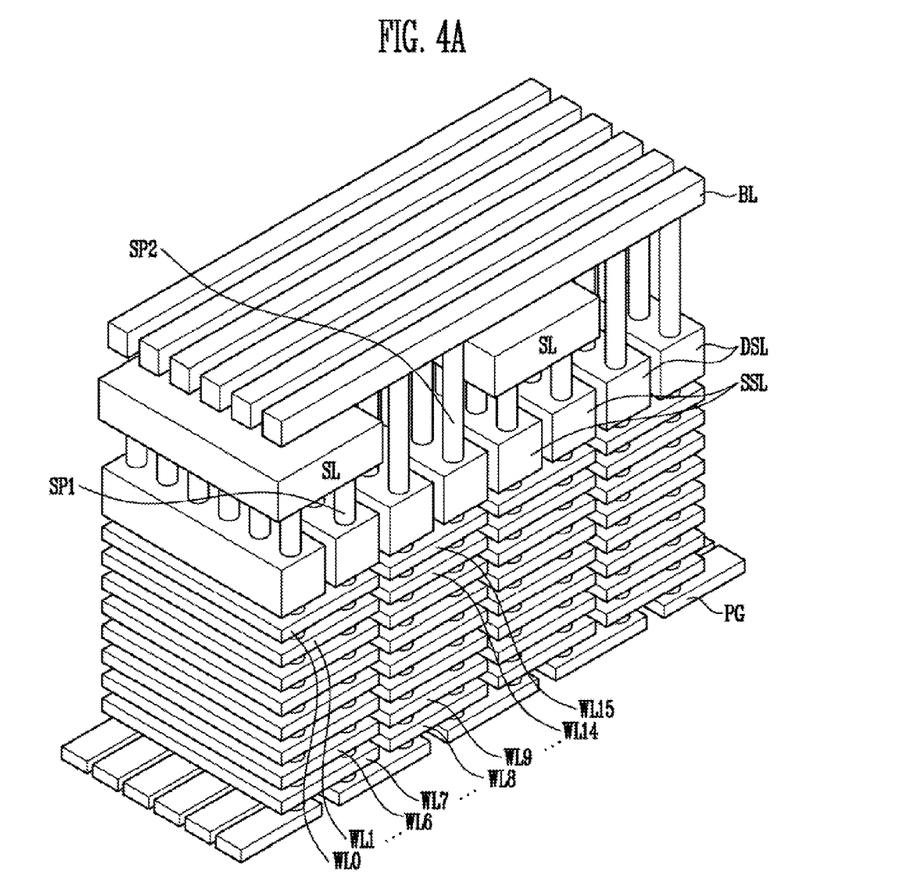
FIGS. 4A and 4B are diagrams illustrating an exemplary embodiment of a memory block in FIG. 2.
Figure 4B:
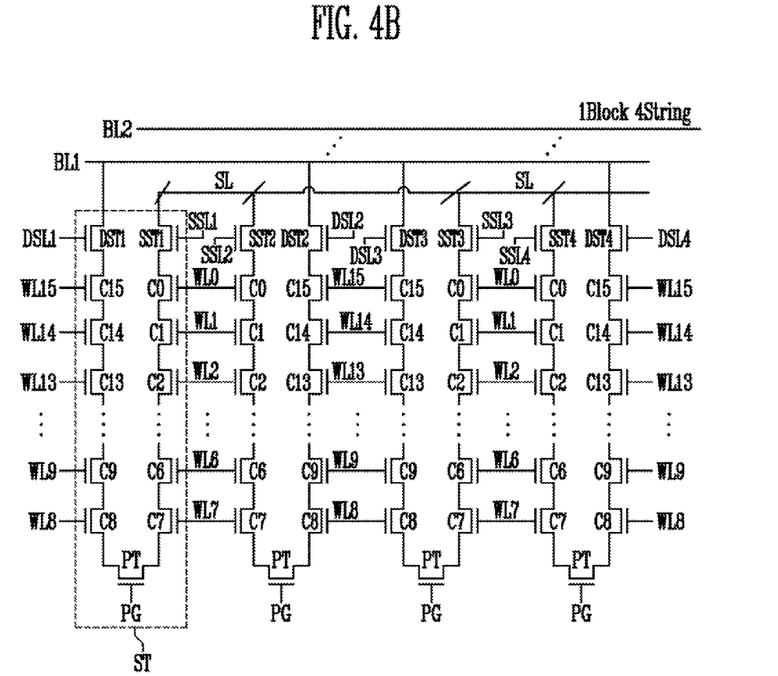

FIG. 2 is a block diagram for describing a semiconductor memory device according to an exemplary embodiment of the present invention, FIGS. 3A and 3B are diagrams for illustrating an exemplary embodiment of a memory block in FIG. 2, and FIGS. 4A and 4B are diagrams for illustrating another exemplary embodiment of a memory block in FIG. 2.

Referring to FIG. 2, the semiconductor memory device may include a memory array 110 and peripheral circuits 120, 130, 140, 150, and 160. The peripheral circuits may include a control circuit 120 and operation circuits 130, 140, 150, and 160. The semiconductor memory device may be a flash memory device in which the operation circuits 130, 140, 150, and 160 may include a voltage supply circuit 130, a page buffer group 140, a column selection circuit 150, and an input/output circuit 160.

The memory array 110 may include a plurality of memory blocks 110MB. Each of the memory blocks 110MB may include a plurality of memory strings. The structure of the memory block 110MB will be described hereinafter.

FIG. 3A is a three-dimensional view illustrating an exemplary embodiment of a memory block in FIG. 2, and FIG. 33 is a three-dimensional equivalent circuit diagram of the memory block in FIG. 3A.

Referring to FIGS. 3A and 3B, a source line SL is formed in a semiconductor substrate where a P-well PW is formed. The source line SL is commonly connected to memory strings and thus may be a common source line CSL. A vertical channel layer SP is formed on the source line SL. An upper part of the vertical channel layer SP is connected to a bit line BL. The vertical channel layer SP may be formed using polysilicon. A plurality of conductive layers SSL, WL0 to WLn, and DSL may be formed to surround the vertical channel layer SP at different levels from the semiconductor substrate. Multi-layers (not shown) may be formed on a surface of the vertical channel layer SP. The multi-layers may also be formed between the vertical channel layer SP and the conductive layers SSL, WL0 to WLn, and DSL.

The lowermost conductive layer may be a source select line SSL, and the uppermost conductive layer may be a drain select line DSL. Conductive layers between the select lines SSL and DSL may be word lines WL0 to WLn. The drain select line DSL may be formed to surround the upper part of the vertical channel layer SP, and the source select line SSL may be formed to surround a lower part of the vertical channel layer SP.

In other words, the conductive layers SSL, WL0 to WLn, and DSL of different levels may be stacked in several layers on the semiconductor substrate, and the vertical channel layer SP passing through the conductive layers SSL, WL0 to WLn, and DSL may perpendicularly connect between the bit line BL and the source line SL formed in the semiconductor substrate.

A drain select transistor DST may be formed at a portion where the uppermost conductive layer DSL surrounds the vertical channel layer SP, and a source select transistor SST may be formed at a portion where the lowermost conductive layer SSL surrounds the vertical channel layer SP. Memory cells C0 to Cn may be formed at a portion where the rest of the conductive lines WL0 to WLn surround the vertical channel layer SP.

Due to the structure illustrated in FIGS. 3A and 3B, the memory string may include the source select transistor SST, the memory cells C0 to Cn, and the drain select transistor DST, all of which are perpendicularly connected to the semiconductor substrate between the source line SL and the bit line BL. This structure is referred as a bit cost scalable (BiCS) structure.

A memory block may include a plurality of memory strings described in FIGS. 3A and 3B.

A memory block having a different structure will be described below.

FIG. 4A is a three-dimensional view for illustrating a different exemplary embodiment of a memory block in FIG. 2, and FIG. 4B is a three-dimensional equivalent circuit diagram of the memory block in FIG. 4A.

Referring to FIGS. 4A and 4B, a pipe gate PG is formed on a semiconductor substrate (not shown), and a horizontal channel layer (not shown) is formed in the pipe gate PG. Vertical channel layers SP1 and SP2 may be formed at both ends of the horizontal channel layer. An upper portion of a first vertical channel layer SP1 may be connected to a source line SL, and an upper portion of a second vertical channel layer SP2 is connected to a bit line BL. The vertical channel layers SP1 and SP2 may be formed of polysilicon.

A plurality of conductive layers WL0 to WL7 and SSL may be formed to respectively surround the first vertical channel layer SP1 at different levels from the semiconductor substrate. A plurality of conductive layers WL8 to WL15 and DSL may be respectively formed to surround the second vertical channel layer SP2 at different levels from the semiconductor substrate. Multi-layers (not shown) including a charge storage layer may be formed on surfaces of the vertical channel layers SP1 and SP2 and the horizontal channel layer. The multi-layers may also be formed between the vertical channel layers (SP1 and SP2) and the conductive layers (SSL, WL0 to WL15, and DSL), and between the horizontal channel layer and the pipe gate PG.

The uppermost conductive layer surrounding an upper part of the first vertical channel layer SP1 may be a source select line SSL, and conductive layers under the source select line SSL may be word lines WL0 to WL7. The uppermost conductive layer surrounding an upper part of the second vertical channel layer SP2 may be a drain select line DSL, and conductive layers under the drain select line DSL may be word lines WL8 to WL15.

In other words, pairs of conductive layers SSL, WL0 to WL15, and DSL may be stacked at different levels on the semiconductor substrate, and the first vertical channel layer SP1 passing through the conductive layers SSL and WL0 to WL7 may perpendicularly connect between one end of horizontal channel layer formed in the pipe gate PG and the source line SL. The second vertical channel layer SP2 passing through the conductive layers DSL and WL8 to WL15 may perpendicularly connect between the other end of the horizontal channel layer formed in the pipe gate PG and the bit lines BL.

A source select transistor SST may be formed at a portion where the uppermost conductive layer SSL surrounds the first vertical channel layer SP1, and memory cells C0 to C7 may be formed at portions where the other conductive layers WL0 to WL7 surround the first vertical channel layer SP1. A drain select transistor DST may be formed at a portion where the uppermost conductive layer DSL surrounds the second vertical channel layer SP2, and memory cells C8 to C15 may be formed at portions where the other conductive layers WL8 to WL15 surround the second vertical channel layer SP2.

Due to the structure illustrated in FIGS. 4A and 48, the memory string may include the source select transistor SST and memory cells C0 to C7, which are perpendicularly connected to the semiconductor substrate between the source line SL and the horizontal channel layer, and the drain select transistor DST and memory cells C8 to C15, which are perpendicularly connected to the semiconductor substrate between the bit lines BL and the pipe gate (PG). This structure may be referred as a pipe-shaped bit cost scalable (P-BiCS) structure.

A memory block may include a plurality of memory strings described in FIGS. 4A and 4B.

Four memory strings ST may be connected to each bit line BL in a memory block, wherein the number of memory strings ST to be connected to one bit line BL may vary. The connection between each memory string ST and the corresponding bit line BL may be controlled by using one of the corresponding drain select line among drain select lines DSL1 to DSL4.

Referring to FIGS. 2, 3B, and 4B, the peripheral circuits 120 to 160 may be configured to perform a program loop, a read loop, and an erase loop of memory cells connected to a selected word line. The peripheral circuits 120 to 160 may include the control circuit 120 for controlling the program loop, read loop, and erase loop, and the operation circuits 130 to 160 configured to perform the program loop, read loop, and erase loop according to control of the control circuit 120. The program loop may include a program operation and a program verification operation, and the program loop may be performed with an incremental step pulse program (ISPP) method. The erase loop may include an erase operation and an erase verification operation, and the erase loop may be performed with an incremental step pulse erase (ISPE) method. In order to perform the program loop, the read loop, and the erase loop, the operation circuits 130 to 160 may be configured to output at least one of operation voltages Vop (i.e. a program voltage, a read voltage, an erase voltage, a pass voltage, a verification voltage, a source voltage, a drain select voltage, a source select voltage, a pipe gate voltage, and a bit line voltage) to at least one of local lines (DSL, WL0 to WL15, SSL, PG, and SL of a selected memory block and bit lines BL) to control a precharge/discharge of the bit lines or to sense a voltage/current of the bit lines under the control of the control circuit 120. The semiconductor memory device may be a NAND flash memory device in which the operation circuit may include a voltage supply circuit 130, a page buffer group 140, a column selection circuit 150, and an input/output circuit 160. Each of the configuration elements will be described below.

The control circuit 120, in response to a command signal CMD of the input/output circuit 160, outputs a voltage control signal VCON to control the voltage supply circuit 130. The voltage supply circuit 130 outputs at least one of the operation voltages Vop. In addition, the control circuit 120 may output page buffer control signals PBCON to control page buffers (not shown) included in the page buffer group 140 in order to perform a program loop, a read loop, and an erase loop. Further, the control circuit 120 may output a row address signal RADD to the voltage supply circuit 130 and may output a column address signal CADD to the column selection circuit. 150 based on a received address signal ADD.

The voltage supply circuit 130, in response to the voltage control signal VCON of the control circuit 120, outputs at least one of the operation voltages Vop. The voltage supply circuit 130, also response to the row address signal RADD of the control circuit 120, outputs at least one of the operation voltages Vop to the local lines SSL, WL0 to WLn (i.e. WL15), DSL, and PG of the selected memory block and a common source line CSL.

The page buffer groups 140 may respectively include a plurality of page buffers (not shown) connected to the memory array 110 through the bit lines BL. During the program operation, the page buffers may selectively precharge the bit lines BL in response to the page buffer control signal PBCON of the control circuit 120 and data DATA to be stored in the memory cells. During the program verification operation or the read operation, the page buffers sense a voltage change and current of the bit lines BL to latch data read from the memory cell after precharging the bit lines BL in response to the page buffer control signal PBCON of the control circuit 120.

The column selection circuit 150, in response to the column address signal CADD of the control circuit 120, may select page buffers included in the page buffer group 140 to sequentially transfer the data DATA to be stored in the memory cells to the page buffers. In addition, the column selection circuit 150, in response to the column address signal CADD, may sequentially select the page buffers in order for the data of the memory cells latched in the page buffers by the read operation to be output to the exterior.

The input/output circuit 160 may transfer the command signal CMD and address signal ADD input from the exterior to the control circuit 120. In addition, the input/output circuit 160 may transfer the data DATA input from the exterior to the column selection circuit 150 during the program operation and may output data DATA read from the memory cells to the exterior during the read operation.

Figure 5:
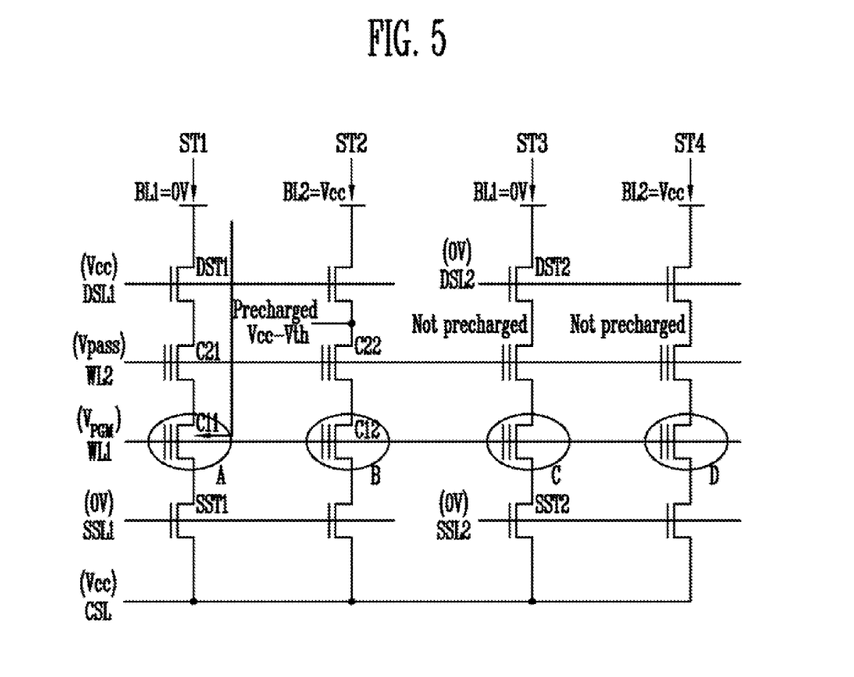
FIG. 5 is a circuit diagram for describing an operating method of a three-dimensional semiconductor memory device such as shown in FIGS. 4A and 4B.

FIG. 5 is a circuit diagram for illustrating an operating method of a three-dimensional semiconductor memory device shown in FIGS. 4A and 4B.

The two-dimensional circuit diagram of FIG. 5 illustrates the memory strings of the three-dimensional semiconductor memory device. As an exemplary embodiment as shown in FIG. 5, four cell strings ST1 to ST4 are connected to two bit lines BL1 and BL2 and each of the cell strings includes two memory cells.

When a data is programmed in a memory cell (C11, A) connected to a first word line WL1 and a first bit line BL1, a ground voltage as a program permission voltage (for example, 0 V) may be supplied to the selected first bit line BL1. In addition, a supply voltage Vcc, which may be supplied as a program inhibition voltage, may be supplied to an unselected second bit line BL2. The supply voltage Vcc is supplied to a selected drain select line DSL1, and the ground voltage (0 V) is supplied to an unselected drain select line DSL2. The ground voltage (0 V) may be supplied to both of source select lines SSL1 and SSL2, and the supply voltage Vcc may be supplied to a common source line CSL. A program voltage Vpgm may be supplied to the selected first word line WL1, and a pass voltage Vpass may be supplied to an unselected second word line WL2.

Because of the voltage supply, a channel of the second string ST2 is precharged to a voltage level between Vcc and Vth, and a memory cell (C12, B) of the second string ST2 may not be programmed due to a channel boosting.

However, channels of the third and fourth cell strings ST3 and ST4 are not precharged. Since a memory cell C of the third cell string ST3 and a memory cell D of the fourth cell string ST4 are not fully channel-boosted, a program disturbance may occur, and thus the memory cells C and D, which are intended not to be programmed, may be programmed.

Accordingly, channels of the program inhibition cells need to be precharged.

Figure 6:
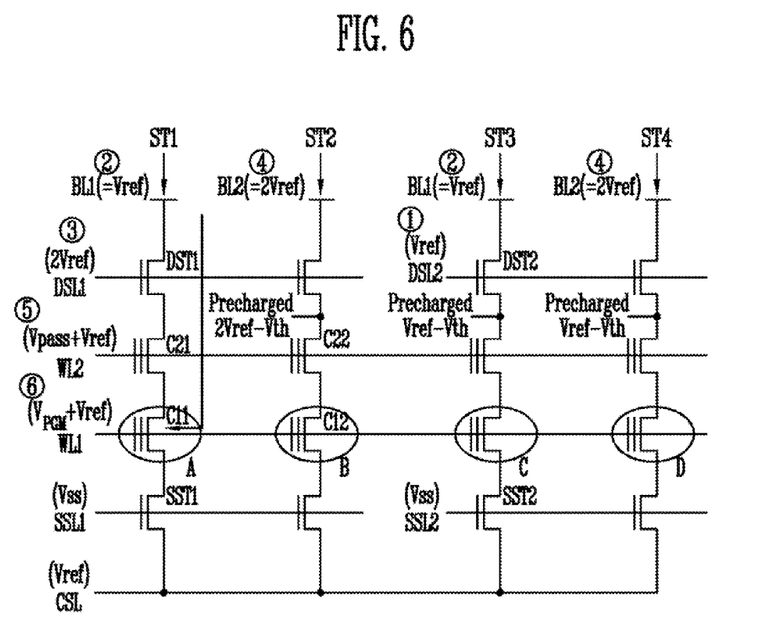
FIGS. 6 to 8 are respectively a circuit diagram, a flowchart, and a timing chart illustrating an operating method of a semiconductor memory device according to an exemplary embodiment of the present invention.
Figure 7:
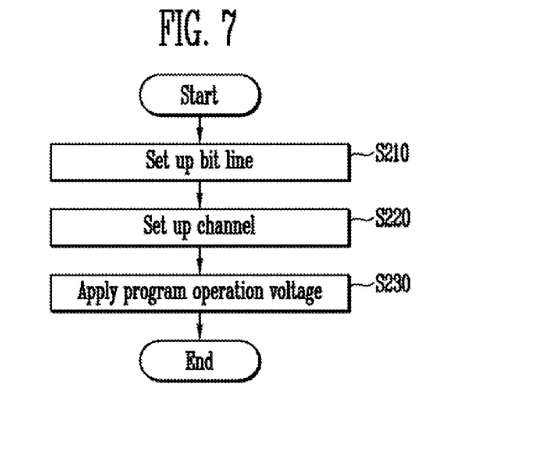
Figure 8:
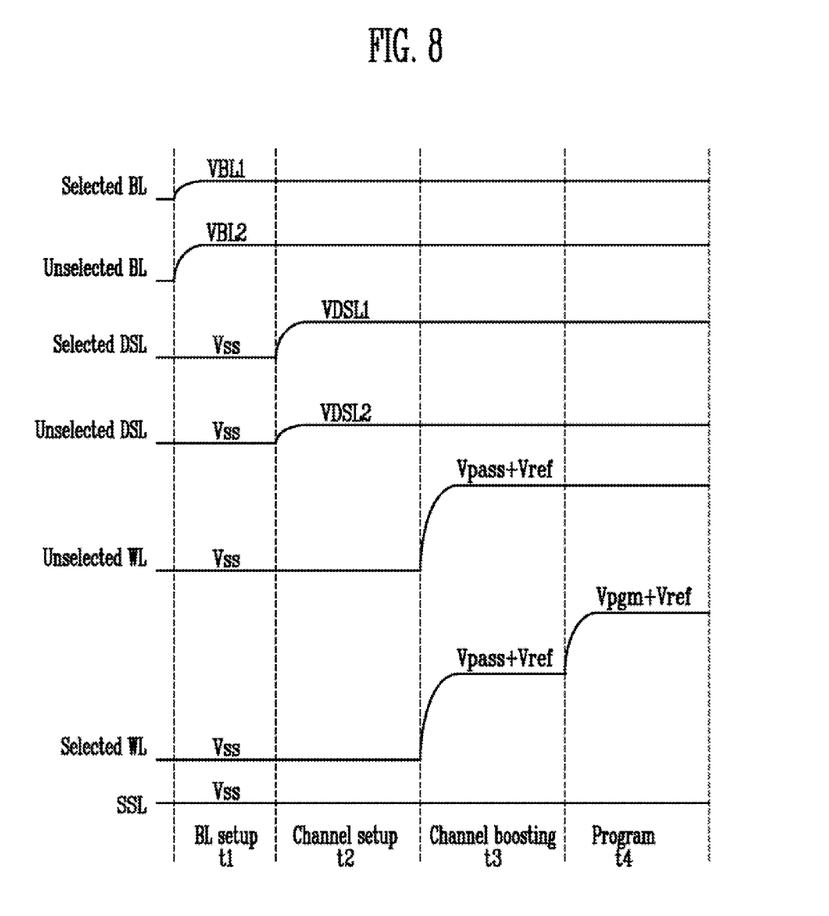
Figure 9:
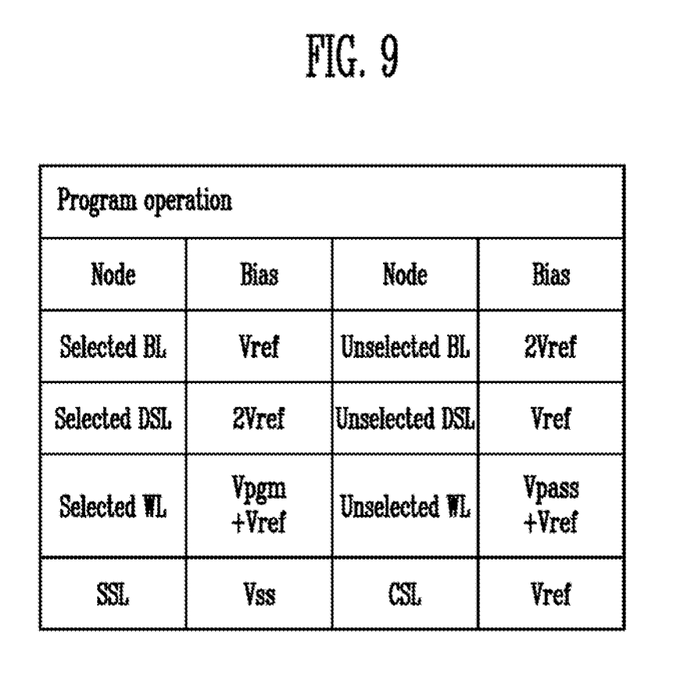
FIG. 9 is a table showing supplied voltages for an operating method shown in FIGS. 6 to 8.

FIGS. 6 to 8 are respectively a circuit diagram, a flowchart, and a timing chart for describing an operating method of a semiconductor memory device according to an exemplary embodiment of the present invention, and FIG. 9 is a table showing supplied voltages for the operating method shown in FIGS. 6 to 8. The circuit structures of FIGS. 5 and 6 may be identical to each other.

Referring to FIG. 6, the supply voltage Vcc is supplied to the second drain select line DSL2 in order to precharge the channel of the third string ST3 (1), and to the first bit line BL1 (2). The channel of the third string ST3 may be precharged to a voltage level between Vref and Vth.

When the reference voltage Vref is supplied to the first bit line BL1, the reference voltage Vref may be supplied to both of a gate and a drain of a first drain select transistor DST1. When the channel voltage increases to the voltage level between Vref and Vth, the first drain select transistor DST1 is turned-off, which makes the channel of a first string ST1 to be boosted, and therefore the selected memory cell A, which is intended to be programmed, may not be programmed. For program of the selected memory cell A, a voltage 2Vref, which is twice higher than the reference voltage Vref, may be applied to the first drain select line DSL1 (3). The application of the voltage 2Vref to the first drain select line DSL1 makes the first drain select transistor DST1 to stay turned on, and thus the channel of the first string ST1 may not be boosted.

Since the channels of the second string ST2 are not boosted when the voltage 2Vref, which is two times higher than the reference voltage Vref is supplied to the first drain select line DSL1, a concern may arise in that the memory cell (C12, B) of the second string ST2 may be programmed. For the boost of the channel of the second string ST2, the voltage 2Vref is supplied to the second bit line BL2 (4). The supply of the voltage 2Vref to the second bit line BL2 makes the second string ST2 precharged to a voltage level between 2Vref and Vth.

The channel of the fourth string ST4 may be precharged to the voltage level between Vref and Vth because the fourth string ST4 is connected to the second bit line BL2 of the supplied voltage 2Vref and the second drain select line DSL2 of the supplied voltage Vref.

In short, the voltage supplied to each of the selected bit line BL1, the unselected bit line BL2, the selected drain select line DSL1, and the unselected drain select line DSL2 is twice higher than the reference voltage Vref. Accordingly, a voltage (Vpgm+Vref), which is elevated over the program voltage Vpgm as much as the reference voltage Vref is supplied to the selected word line WL1 (6), and a voltage (Vpass+Vref), which is elevated over the pass voltage Vpass as much as the reference voltage Vref may be supplied to the unselected word line WL2 for a stable program operation (5).

As described above since all of the channels of the second to fourth strings ST2 to ST4 are precharged, the unselected memory cells B, C, and D of the precharged strings ST2 to ST4 is not programmed because of the channel boosting. In addition, the increase of a voltage level of the bit line causes the decrease of the leakage current flowing through the drain select line. Accordingly, the program disturbance may be prevented.

The specific voltages set forth in this detailed description of the present invention are selected for convenience of description, and are not intended to limit the scope of the present invention.

Referring to FIGS. 7 to 9, in the operating method of a semiconductor memory device according to an exemplary embodiment of the present invention, bit lines may be set up (S210, t1). A first bit line voltage VBL1 may be supplied to a selected bit line among the bit lines, and a second bit line voltage VBL2 higher than the first bit line voltage VBL1 may be supplied to an unselected bit line. For example, the level of the first bit line voltage VBL1 (i.e. the supply voltage Vcc) may be lower than the level of the second bit line voltage VBL2 (i.e. 2Vcc). Drain select lines, word lines, and source select lines may stay at the voltage level of the supply voltage Vcc during the setup of bit lines.

Next, channels are set up (S220, t2). A first drain select voltage VDSL1 may be supplied to a selected drain select line among drain select lines and a second drain select voltage VDSL2 may be supplied to an unselected drain select line. For example, the level of the first drain select voltage VDSL1 (i.e. 2Vcc) may be higher than the level of the second drain select voltage VDSL2 (i.e. Vcc).

Memory cells A to D are included in a first to fourth strings ST1 to ST4, respectively. A channel of the first string ST1 may be set up by the first bit line voltage VBL1 and the first drain select voltage VDSL1. A channel of the second string ST2 may be set up by the second bit line voltage VBL2 and the first drain select voltage VDSL1. A channel of the third string ST3 may be set up by the first bit line voltage VBL1 and the second drain select voltage VDSL2. A channel of the fourth string ST4 may be set up by the second bit line voltage VBL2 and the second drain select voltage VDSL2.

As a result of the setup of the bit lines and the channels, the channels of the second to fourth strings are in the floating state due to precharge of the channels and turn-off of drain select transistors.

When the channels are set up, a program operation voltage may be supplied (S230).

The supply of the program operation voltage causes channel boosting (t3). When channels of memory strings are in the floating state due to the precharge of the channels and turn-off of drain select transistors, the channel boosting may be caused by the supply of a preset voltage to the word lines. Accordingly, the voltage level of the channels of the second to fourth strings ST2 to ST4 rises when the preset voltage is supplied. As an exemplary embodiment, a voltage (Vpass+Vref) as the pass voltage may be supplied to the selected and unselected word lines. The reference voltage Vref may be the supply voltage Vcc.

Finally, data is programmed to the selected memory cell by the supply of a voltage level (Vpgm+Vref) to the selected word line.

Meanwhile, a ground voltage Vss may be supplied to a source select line SSL during the bit line setup stage (t1), the channel setup stage (t2), the channel boosting stage (t3), and the programming stage (t4), all of which mean that the memory strings may be separated from a common source line CSL during the stages. The ground voltage Vss may be 0V.

Figure 10:
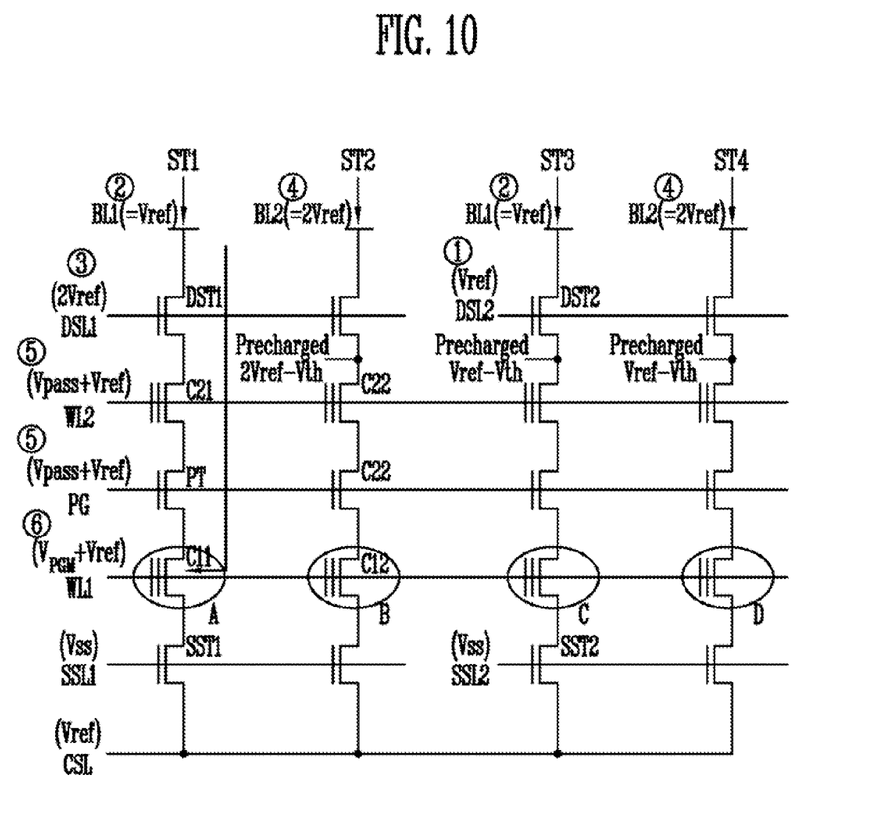
FIG. 10 is a circuit diagram illustrating an operating method of a semiconductor memory device according to an exemplary embodiment of the present invention.

FIG. 10 is a circuit diagram for illustrating an operating method of a semiconductor memory device according to another exemplary embodiment of the present invention.

A memory string of the P-BiCS structure will be described as the exemplary embodiment of the present invention in FIG. 10.

Referring to FIG. 10, the operating method of a semiconductor memory device may include supply of a voltage (Vpass+Vref) to a pipe gate line PG as well as other unselected word lines (⑤). The rest of the operating method is substantially the same as those described with reference to FIG. 6.

Figure 11:
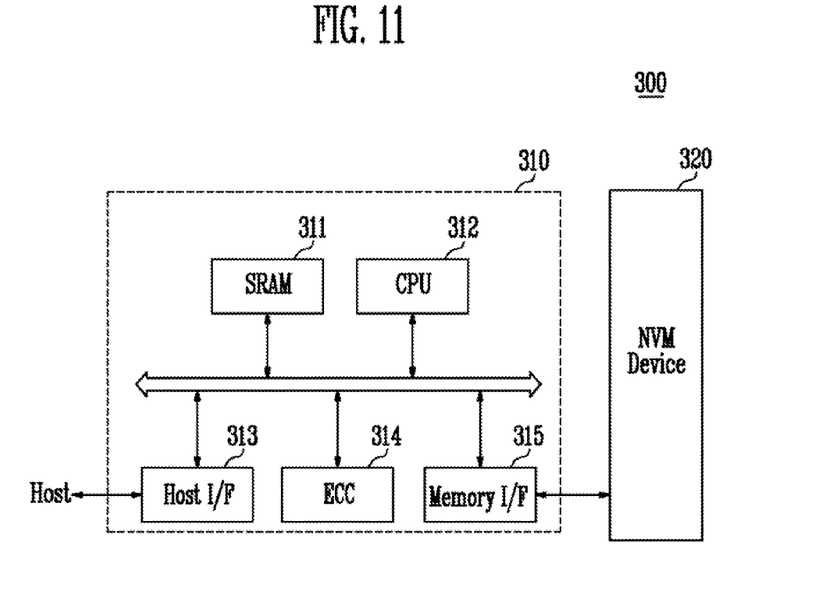
FIG. 11 is a block diagram schematically illustrating a memory system according to an exemplary embodiment of the present invention.

FIG. 11 is a block diagram schematically illustrating a memory system according to an exemplary embodiment of the present invention.

Referring to FIG. 11, the memory system 300 according to an exemplary embodiment of the present invention may include a non-volatile memory device 320 and a memory controller 310.

The non-volatile memory device 320 may be configured with the semiconductor memory device described above and operated by the method described above for compatibility with the memory controller 310. The memory controller 310 may be configured to control the non-volatile memory device 320. The memory system 300 may be used in a memory card or a solid state disk (SSD) by the combination of the non-volatile memory device 320 and the memory controller 310. An SRAM 311 may be used as an operation memory of a processing unit 312. A host interface 313 may include a data exchange protocol of a host connected to the memory system 300. An error correction block 314 may detect and correct an error included in data read from the non-volatile memory device 320. The memory interface 315 may perform interfacing with the non-volatile memory device 320 of the embodiment of the present invention. The processing unit 312 may perform overall control operation for data exchange of the memory controller 310.

Although not shown in FIG. 10, it is obvious to a person having ordinary skill in the art that the memory system 300 according to the embodiment of the present invention may further include a ROM storing code data for interfacing with a host. The non-volatile memory device 320 may be used in a form of multi-chip package configured with two or more flash memory chips. The memory system 300 may be used as a storage medium with high reliability and a low error rate. Specifically, the flash memory device of the embodiment of the present invention may be used in a memory system such as an SSD, which has been actively studied in recent years. In this case, the memory controller 310 may be configured to communicate with the exterior (for example, a host) through one of a variety of interface protocols such as USB, MMC, PCI-E, SATA, PATA, SCSI, ESDI, and IDE.

Figure 12:
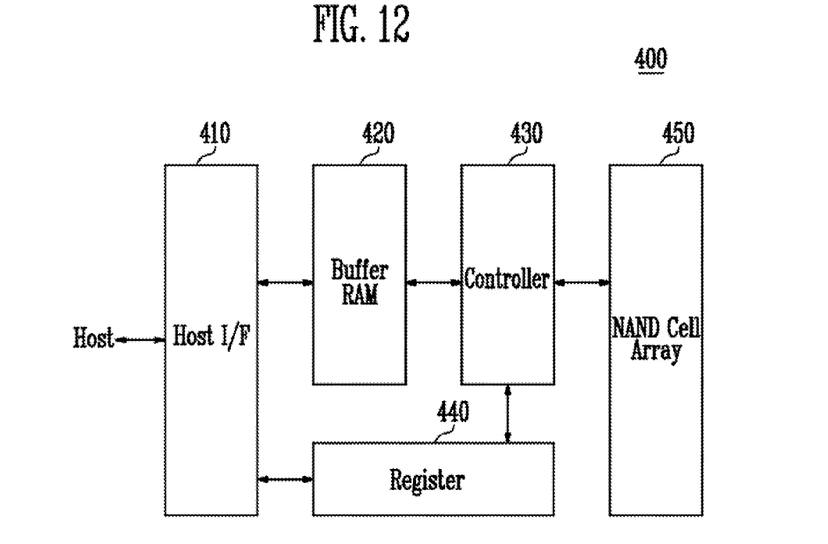
FIG. 12 is a block diagram illustrating a fusion memory device or fusion memory system in which a program operation is performed according to various exemplary embodiments of the present invention.

FIG. 12 is a block diagram illustrating a fusion memory device or fusion memory system in which a program operation is performed according to various exemplary embodiments described above. For example, the inventive concept may be applied to an OneNAND flash memory device 400 as a fusion memory device.

The OneNAND flash memory device 400 may include a host interface 410 for exchanging various information with a device using different protocols from each other, a buffer RAM 420 for storing code for operating the memory device or temporarily storing data, a controller 430 for reading, programming, and controlling all the statuses in response to a control signal or a command from the outside, a register for storing data such as a command, an address, and a configuration defining a system operating environment of the inside of the memory device, and a NAND flash cell array configured with an operation circuit including a non-volatile memory cell and a page buffer. The OneNAND flash memory device 400 may program data according to the method described above in response to a write request from the host.

Figure 13:
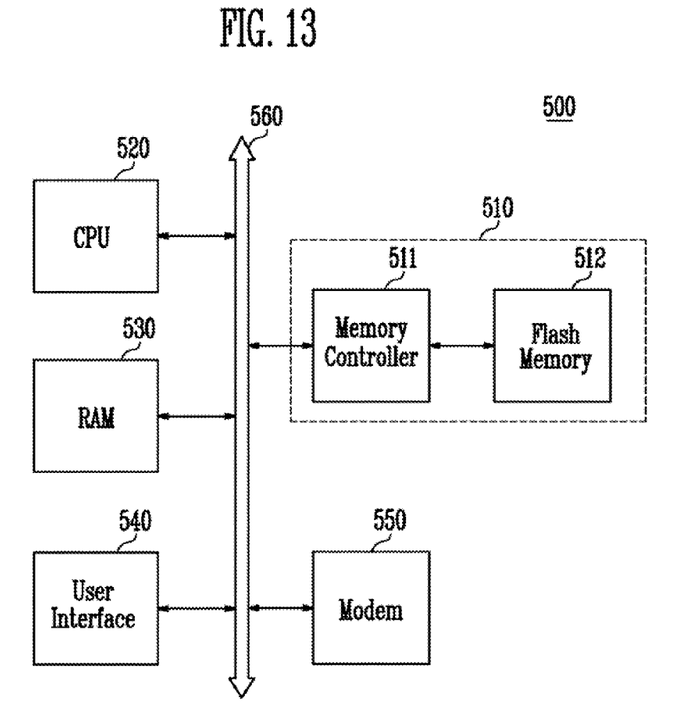
FIG. 13 is a block diagram schematically illustrating a computing system including a flash memory device according to an exemplary embodiment of the present invention.

A computing system including a flash memory device 512 according to the present invention is schematically illustrated in FIG. 13.

The computing system 500 according to the present invention may include a microprocessor connected to a system bus 560, a RAM, a user interface 540, a modem 550 such as a baseband chipset, and a memory system 510. When the computing system 500 according to the present invention is a mobile apparatus, a battery (not shown) for supplying an operation voltage to the computing system 500 may be further included. Although not shown in FIG. 13, the computing system 500 according to the present invention may further include an application chipset, a camera image processor (CIS), a mobile DRAM, etc. The memory system 510 may configure, for example, an SSD, which uses a non-volatile memory to store data. Otherwise, the memory system 510, for example, may be provided in a fusion flash memory (for example, an OneNAND flash memory).

According to the exemplary embodiments of the present invention above, a channel of an unselected cell string may be precharged by adjusting a bit line voltage and drain select voltage of the unselected cell string.

Since the channel boosting may be stably performed in the unselected cell string, and leakage current through a drain select line may be reduced, the program disturbance may be decreased, and thus the reliability of the semiconductor memory device may be improved.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An operating method of a semiconductor memory device having plural memory strings each of which has plural memory cells defined by word lines surrounding a vertical channel layer at different levels from a semiconductor substrate, the vertical channel layer connected between a bit line and a common source line, the method comprising:

supplying a first voltage to a selected bit line where a selected memory cell among the memory cells is connected and a second voltage, which is higher than the first voltage, to an unselected bit line;

supplying a third voltage to a selected drain select line where the selected memory cell is connected and a fourth voltage, which is lower than the third voltage, to an unselected drain select line; and supplying a fifth voltage to a selected word line where the selected memory cell is connected and a sixth voltage, which is lower than the fifth voltage, to unselected word lines, for a program operation.

2. The method of claim 1, wherein the first voltage is at substantially the same level as the fourth voltage.

3. The method of claim 1, wherein the second voltage at substantially the same level as the third voltage.

4. The method of claim 1, wherein the fifth voltage is higher than a program voltage which is supplied to the selected word line in the program operation.

5. The method of claim 1, wherein the sixth voltage is higher than a pass voltage which is supplied to the unselected word lines in the program operation.

6. The method of claim 1, wherein the step of supplying the fifth voltage and the sixth voltage comprises:

supplying the sixth voltage to the selected word line and the unselected word lines; and increasing a voltage level of the selected word line to a level of the fifth voltage.

7. The method of claim 1, wherein the first voltage is higher than a ground voltage.

8. A semiconductor memory device, comprising:

a memory block including plural memory strings each of which has plural memory cells defined by word lines surrounding a vertical channel layer at different levels from a semiconductor substrate, wherein the vertical channel layer is connected between a bit line and a common source line; and a peripheral circuit configured to supply a first voltage to a selected bit line to which selected memory cells are connected, a second voltage higher than the first voltage to an unselected bit line, a third voltage to a selected drain select line to which the selected memory cell is connected, a fourth voltage lower than the third voltage to an unselected drain select line, a fifth voltage to a selected word line to which the selected memory cell is connected, and a sixth voltage lower than the fifth voltage to unselected word lines, during a program operation.

9. The semiconductor memory device of claim 8, wherein the first voltage is at substantially the same level as the fourth voltage.

10. The semiconductor memory device of claim 8, wherein the second voltage is at substantially the same level as the third voltage.

11. The semiconductor memory device of claim 8, wherein the fifth voltage is higher than a program voltage which is supplied to the selected word line in the program operation.

12. The semiconductor memory device of claim 8, wherein the sixth voltage is higher than a pass voltage which is supplied to the unselected word lines in the program operation.

13. The semiconductor memory device of claim 8, wherein the peripheral circuit supplies the sixth voltage to the selected word line and the unselected word lines, and increases a voltage level of the selected word line to a level of the fifth voltage.

14. The semiconductor memory device of claim 8, wherein the first voltage is higher than a ground voltage.

15. A semiconductor memory device, comprising:

a memory block including word lines surrounding a vertical channel layer connected between one of bit lines and a common source line at different levels from a semiconductor substrate, and including plural memory strings each of which has plural memory cells formed at areas at which the word lines surround the vertical channel layer;

a page buffer connected to the memory block through the bit lines and configured to supply a first voltage to a selected bit line to which selected memory cells are connected and a second voltage higher than the first voltage to an unselected bit line during a program operation; and a voltage supply connected to the memory block through the word lines and select lines, and configured to supply a third voltage to a selected drain select line to which the selected memory cell is connected, a fourth voltage lower than the third voltage to an unselected drain select line, a fifth voltage to a selected word line to which the selected memory cell is connected, and a sixth voltage lower than the fifth voltage to unselected word lines, during the program operation.

16. The device of claim 15, wherein the first voltage is at substantially the same level as the fourth voltage.

17. The device of claim 15, wherein the second voltage is at substantially the same level as the third voltage.

18. The device of claim 15, wherein the fifth voltage is higher than a program voltage which is supplied to the selected word line in the program operation.

19. The device of claim 15, the sixth voltage is higher than a pass voltage which is supplied to the unselected word lines in the program operation.

20. The device of claim 15, wherein the voltage supply applies the sixth voltage to the selected word line and the unselected word lines, and increases a voltage level of the selected word line to a level of the fifth voltage.

* * * * *